United States Patent [19]

Okano et al.

[11] 4,341,011

[45] Jul. 27, 1982

[54] METHOD OF MANUFACTURING SEMICONDUCTOR DEVICE

[75] Inventors: Sadao Okano; Hideo Homma, both of Hitachi, Japan

[73] Assignee: Hitachi, Ltd., Tokyo, Japan

[21] Appl. No.: 193,456

[22] Filed: Oct. 3, 1980

[30] Foreign Application Priority Data

Oct. 5, 1979 [JP] Japan .................................. 54/127966

[51] Int. Cl.³ ............................................ H01L 21/92
[52] U.S. Cl. ...................................... 29/590; 29/591; 357/52
[58] Field of Search ............ 29/591, 590, 583, 576 R; 357/45, 47, 49, 52

[56] References Cited

U.S. PATENT DOCUMENTS 3,303,400 2/1967 Allison .................................. 357/45
3,543,102 11/1970 Dahlberg et al. .................. 361/417

Primary Examiner—Donald L. Walton
Attorney, Agent, or Firm—Craig and Antonelli

[57] ABSTRACT

A method of manufacturing a semiconductor device comprising preparing a semiconductor substrate which includes at least three semiconductor layers of alternately different conductivity types and in which one of the semiconductor layers is divided into a plurality of respectively independent regions on each of which an electrode film is provided. When one of the regions of the semiconductor layer is found defective, a substantial portion of the electrode film provided on the defective region is removed by trimming to lower the surface level of the electrode film relative to the others.

10 Claims, 6 Drawing Figures

METHOD OF MANUFACTURING SEMICONDUCTOR DEVICE

FIELD OF THE INVENTION

This invention relates to a method of manufacturing semiconductor devices, and more particularly to a method of manufacturing a semiconductor device such as a gate turn-off thyristor (abbreviated herein after as a GTO), a transistor, a static induction thyristor or a static induction transistor.

A semiconductor device of the kind as described above comprises a semiconductor substrate which includes at least three semiconductor layers of alternately different conductivity types, and one of these semiconductor layers is divided into a plurality of respectively independent regions on each of which an electrode film is provided. One of the semiconductor layers of the semiconductor substrate is divided into such a plurality of respectively independent regions so as to satisfy the electrical characteristics required for that semiconductor device.

DESCRIPTION OF THE PRIOR ART

Figure 1:
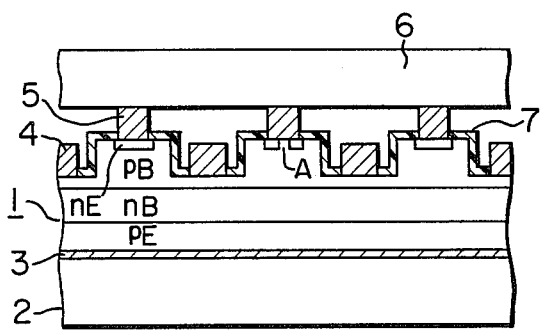
FIG. 1 is a schematic vertical sectional view of part of a prior art GTO having a defect.

FIG. 1 shows, by way of example, the structure of a prior art GTO. Referring to FIG. 1, the GTO comprises a semiconductor substrate 1 of four-layer structure which is composed of a $p_E$ layer, an $n_B$ layer, a $p_B$ layer and an $n_E$ layer of alternately different conductivity types. The semiconductor substrate 1 is securely fixed to a supporting plate 2 by a soldering material 3. Gate electrode films 4 are provided on the $p_B$ layer. The $n_E$ layer is divided into a plurality of respectively independent regions on each of which a cathode electrode film 5 is provided. A cathode electrode plate 6 is provided on the cathode electrode films 5. A surface stabilizing film 7 of material such as $SiO_2$ covers the upper main surface of the semiconductor substrate 1 except the portions having the films 4 and 5 as shown.

The semiconductor substrate 1, supporting plate 2 and cathode electrode plate 6 partly shown in FIG. 1 are circular or square in shape. The assembly of the semiconductor substrate 1, supporting plate 2 and cathode electrode plate 6 is enclosed within a gas-tight sealed container (not shown) constructed by, for example, a hollow cylindrical member of a ceramic material and a pair of electrode members of material such as copper mounted in both opposite end openings respectively by flanges of material such as Ferni (Fe-Ni). The supporting plate 2 is firmly fixed to or arranged to be slidable to engage with one of the electrode members, while the cathode electrode plate 6 is arranged to be slidable to engage with the other electrode member. Pressures are imparted to force the two electrode members toward each other so that all of these members can be firmly coupled together in both the electrical aspect and the thermal aspect. The gate electrode films 4 are electrically connected to a gate lead which passes through a metal pipe disposed in the hollow cylindrical member to extend into the gas-tight sealed container.

In order to facilitate transition of the GTO from its conducting state to its blocking state, the $n_E$ layer is divided into a plurality of elongate strip-shaped regions of very short width so that current carriers can reach the gate electrode films 4 as quick as possible. To this end, the $p_B$ layer is arranged to surround each region of the $n_E$ layer. The cathode electrode films 5 deposited on the $n_E$ regions have generally a width of about 200 μm to 300 μm and a thickness of about 10 μm. Therefore, when the structure is such that current flows in the longitudinal direction of the cathode electrode films 5, a great voltage drop will occur resulting in difficulty of achieving a large capacity. To obviate this difficulty, a design is frequently employed in which the thick cathode electrode plate 6 is brought into engagement with the entire surface of the cathode electrode films 5 so that the main current path extends substantially in the vertical direction of the cathode electrode films 5 as shown in FIG. 1, thereby minimizing the resistance of the electrode portions to such an extent that it is almost negligible. It is necessary to electrically isolate the cathode electrode films 5 from the gate electrode films 4, and there are two methods for satisfying this requirement. According to one of the methods, the height of the cathode electrode films 5 is selected to be different from that of the gate electrode films 4, and according to the other method, the cathode electrode plate 6 is formed with grooves or recesses at portions corresponding to the positions of the gate electrode films 4 so that the cathode electrode plate 6 can engage only with the cathode electrode films 5 without engaging with the gate electrode films 4. The present invention has a concern with the former method and will now be described, by way of example, with reference to its application to a GTO structure in which the surface of the cathode portion and that of the gate portion in the semiconductor substrate 1 have different relative heights, and the electrode films 4 and 5 have the same thickness.

The GTO having such a structure may include a defect such as that indicated by the character A in FIG. 1, in which the $p_B$ layer is in direct contact with the cathode electrode film 5 deposited on one of the $n_E$ regions, due to the presence of the defect A in this $n_E$ region. Consequently, when a positive signal and a negative signal are applied to the cathode electrode films 5 and gate electrode films 4 respectively to block the GTO from its conducting state, the gate current will flow only through the defective portion A of the $n_E$ region, and the GTO would not be blocked from its conducting state.

In the GTO of large capacity, the number of $n_E$ regions electrically isolated from each other and extending in, for example, a radial direction in an elongate strip form is large, and the $n_E$ regions occupy a large area. Complete absence of a defect as described above in the general manufacturing conditions of the GTO is almost substantially impossible as a matter of fact. When the dust level of the atmosphere supplied during the manufacture of GTO's was, for example, 100 (meaning that 100 dust particles each having a particle diameter of about 0.5 μm exist in a volume of 1 cubic inch), the yield of defect-free GTO's having 72 $n_E$ regions each having an area of 0.0122 cm² (6.1 mm long×0.2 mm wide) was only 63%. On the other hand, the yield of the GTO's having less than two defective $n_E$ regions was 97%.

It is thus difficult to reduce the number of inferior goods due to the presence of the defect in spite of all the efforts to improve the dust level and other manufacturing conditions. Therefore, the yield can be remarkably improved if the defect could be eliminated by some effective means without adversely affecting the electrical characteristics of the semiconductor device when put into practical use.

SUMMARY OF THE INVENTION

An object of the present invention is to provide a method of manufacturing a semiconductor device so as to improve the yield.

Another object of the present invention is to provide a method of manufacturing a semiconductor device by which defect portions can be rendered inactive.

Still another object of the present invention is to provide a method of manufacturing a semiconductor device in which an electrode film deposited on a semiconductor layer involving a defect therein is removed by trimming so that defect portions can be rendered inactive.

The method of manufacturing a semiconductor device according to the present invention is characterized in that an electrode film deposited on a semiconductor layer involving a defect therein is removed by trimming with a cutting tool which is imparted with a predetermined load and which is applied to trimming engagement with a surface stabilizing film without making direct engagement with the semiconductor substrate.

In the case of, for example, a GTO, the defect A can be simply detected by erecting a probe on each of the cathode electrode films, erecting a common probe on the gate electrode films, being applied reverse voltage between the $n_E$ regions and the $p_B$ layer, and measuring the current flow through the pn junctions.

The material of the surface stabilizing film preferably employed in the present invention is any one of those including silicon nitride $Si_3N_4$, SiN, a $P_2O_5$-$SiO_2$ glass and a $B_2O_3$-$SiO_2$ glass. The material of the electrode film preferably employed in the present invention is any one of those including Al, an Al-Si alloy, an Au-Cu alloy, an Ag solder and a Pb solder.

DETAILED DESCRIPTION OF THE PREFERRED EMBODIMENTS

Preferred embodiments of the method according to the present invention will now be described in detail with reference to FIGS. 2 to 6.

Figure 2:
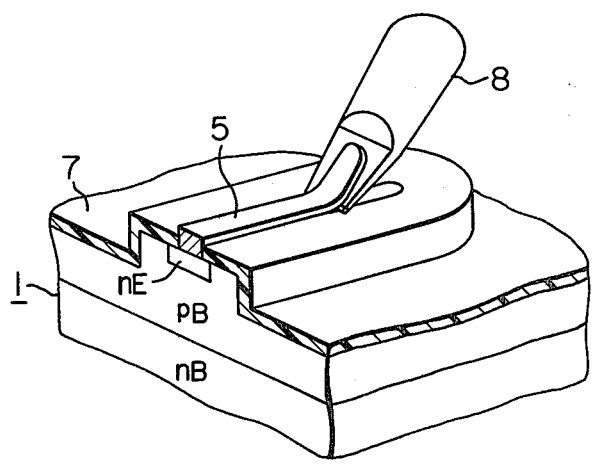
FIG. 2 is a schematic perspective view of part of a GTO in the step of trimming for illustrating an embodiment of the method of manufacturing a semiconductor device according to the present invention.

FIG. 2 is a schematic perspective view for illustrating the trimming process according to an embodiment of the present invention. The material of the semiconductor substrate 1 of the GTO is silicon, and the $n_E$ layer is divided into 72 emitter regions.

The cathode film 5 of aluminum deposited on each of the 72 emitter regions has a thickness of 15 μm and a width of 200 μm. The width of the cutting edge of the cutting tool 8 is 300 μm, and the cutting tool 8 is contacted to make a cutting angle of 45° between it and the main surface of the semiconductor substrate 1. The cutting tool 8 is of the type loaded with a spring imparting a predetermined load of 110 grams, and the cutting speed is about 3 mm/sec. When the cutting tool 8 brought into engagement with the $SiO_2$ film 7 is advanced in parallel to the substrate surface, the cathode electrode film 5 of aluminum is cut away at a boundary between the surface of the $SiO_2$ film 7 and the surface of the $n_E$ region. The $SiO_2$ film 7 is harder than the cutting tool 8 and has a smooth surface. Therefore, the cutting tool 8 pressed onto the surface of the $SiO_2$ film 7 trims only the cathode electrode film 5 without cutting the $SiO_2$ film 7. Thus, the $SiO_2$ film 7 performs also the function of a zig which determines the depth of cutting by the cutting tool 8.

The $SiO_2$ film 7 is primarily deposited to act as a surface stabilizing film. It is apparent that any suitable material other than $SiO_2$ can be utilized, provided that it exhibits the surface stabilizing function, is harder than the material of the cutting tool 8 and has a smooth surface. In order to leave a portion of the cathode electrode film 5 between the surface of the $n_E$ region and the surface of the $SiO_2$ film 7 at the trimming process, it is desirable that any heat treatment resulting in alloying of the cathode electrode film 5 of aluminum with the semiconductor substrate 1 of silicon should not be applied after the deposition of the cathode electrode film 5 and before the step of trimming with the cutting tool 8. This is because, when aluminum forming the cathode electrode film 5 is alloyed with silicon forming the semiconductor substrate 1, a portion of the semiconductor substrate 1 will also be removed together with the substantial portion of the cathode electrode film 5 during the trimming process with the cutting tool 8. In an experiment in which the semiconductor substrate 1 having the cathode electrode film 5 of aluminum was subjected to heat treatment or sintering treatment for 10 minutes in an atmosphere of nitrogen at 410° C., and the trimming was then applied, the results of measurement of the electrical characteristics proved that damage to the semiconductor substrate 1 extended to the depth of the pn junction between the $n_E$ region and the $p_B$ layer. The results of observation on the damaged portion of the semiconductor substrate 1 indicated peeling-off of a very thin portion of silicon together with removed aluminum.

Figure 3:
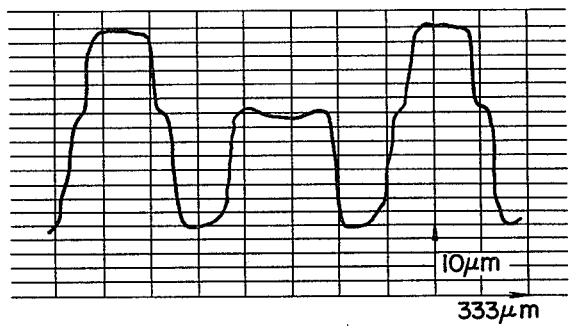
FIG. 3 illustrates the state of surface roughness of the semiconductor substrate of the GTO after the step of trimming shown in FIG. 2.

The surface roughness of the cathode electrode film 5 trimmed with the cutting tool 8 without application of such a heat treatment was measured by a surface roughness tester, and the results of measurement are shown in FIG. 3.

Cutting marks peculiar to cutting with the cutting tool 8 remain on the surface of the cathode electrode film 5 by application of the present trimming process.

Figure 4:
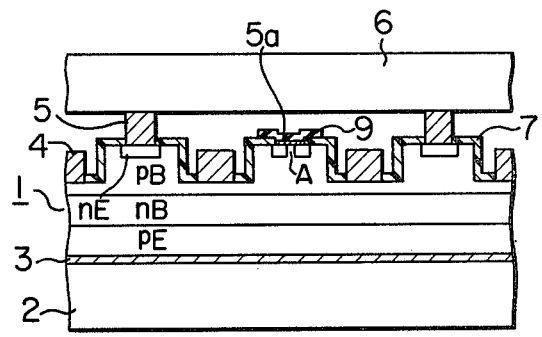
FIG. 4 is a schematic vertical sectional view similar to FIG. 1 to show the GTO obtained by the method of manufacturing a semiconductor device according to the present invention.

FIG. 4 shows the state of the semiconductor substrate 1 having been subjected to the trimming and ready to be put into use.

It will be seen that the portion, designated by 5a, of the cathode electrode film 5 remains without being removed by trimming. It is desirable that the space between the cathode electrode plate 6 and the semiconductor substrate 1 is satisfactorily electrically insulated. For this purpose, an electrical insulating film 9 is deposited or coated on the portion 5a of the cathode electrode film 5 left after the trimming.

Very good results were obtained when polyimide type resin was employed as the material of the insulating film 9.

The results of measurement of the electrical characteristics of the semiconductor device employing the semiconductor substrate 1 which was subjected to the trimming proved that the anode-cathode voltage-current characteristic in the reverse direction was not affected by the trimming, and the dynamic and static characteristics including the turn-on and turn-off switching characteristics were also not affected by the trimming.

Thus, according to the aforementioned embodiment of the present invention, the function of the semiconductor substrate is not in any way adversely affected by trimming of a cathode electrode film on a defective $n_E$ region with a cutting tool, and the defective $n_E$ region can simply be made not to be used, so that the remaining defect-free $n_E$ regions can efficiently be utilized.

Although an application of the present invention to a GTO has been described hereinbefore by way of example, it is apparent that the present invention is equally effectively applicable to other semiconductor devices such as a transistor.

Further, in the GTO structure to which the present invention is applied, the $n_E$ layer and the $p_B$ layer formed in the upper main surface of the semiconductor substrate 1 are disposed in a vertically offset relation as seen in FIG. 4. However, the present invention is also applicable to a GTO structure in which the $n_E$ layer and the $p_B$ layer are disposed on the same plane. Furthermore, the configuration of the pn junctions in the semiconductor substrate is in no way limited to that illustrated in FIG. 4, but the present invention is also applicable to semiconductor substrates formed with any other pn junction configurations.

In another embodiment of the present invention, the method of the present invention is applied to a transistor of three-layer structure or pnp structure.

Figure 5:
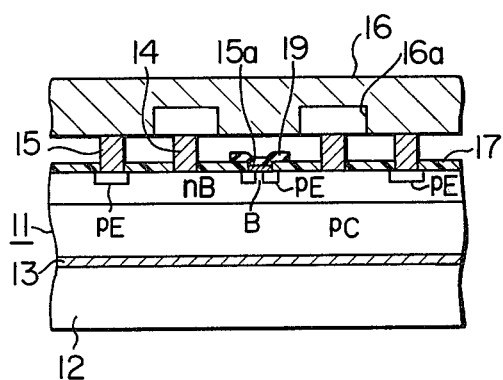
FIGS. 5 and 6 are schematic vertical sectional views of part of a transistor and a static induction thyristor respectively manufactured by the method of manufacturing a semiconductor device according to the present invention.

Referring to FIG. 5, the transistor comprises a semiconductor substrate 11 of three-layer structure which is composed of a $p_C$ layer, an $n_B$ layer and a $p_E$ layer of alternately different conductivity types. The semiconductor substrate 11 is securely fixed to a supporting plate 12 by a soldering material 13. Base electrode films 14 are provided on the $n_B$ layer, and emitter electrode films 15 are provided on the $p_E$ layer. An emitter electrode plate 16 is provided on the emitter electrode films 15. A surface stabilizing film 17 of material such as SiO₂ covers the upper main surface of the semiconductor substrate 11 except the portions having the films 14 and 15 as shown.

The upper main surface of the semiconductor substrate 11 is flat, and the base electrode films 14 and the emitter electrode films 15 have the same height. The emitter electrode plate 16 is formed with grooves 16a at portions corresponding to the base electrode films 14 so that the base electrode films 14 may not make contact with the emitter electrode plate 16.

As in the GTO structure shown in FIG. 4, the $p_E$ layer is divided into a plurality of respectively independent regions each in the form of an elongate strip.

FIG. 5 shows that a defect such as that indicated by the character B may be present in one of the $p_E$ regions, and due to the presence of such a defect B, the associated emitter electrode film 15 may be in direct electrical contact with the $n_B$ layer. When the emitter electrode film 15 deposited on the defective $p_E$ region engages with the emitter electrode plate 16, no transistor action takes place in the semiconductor substrate 11.

To obviate the above trouble, the emitter electrode film 15 deposited on the defective $p_E$ region is removed by trimming according to the method of the present invention with a cutting tool in a manner similar to that shown in FIG. 2. The numeral 15a in FIG. 5 designates the portion of the emitter electrode film 15 left after the trimming process. An electrical insulating film 19 is then deposited to cover the remaining film 15a for the purpose of electrical insulation. The defective portion of the semiconductor substrate 11 is rendered inactive by the trimming so that the semiconductor substrate 11 can fully perform the transistor function.

Figure 6:
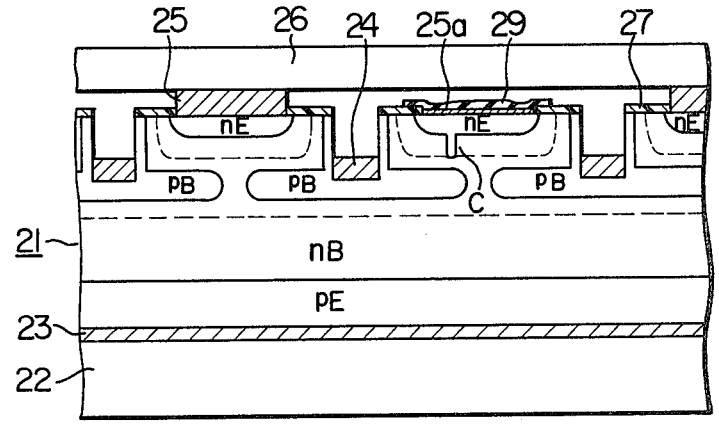

In still another embodiment of the present invention, the method of the present invention is applied to a static induction thyristor as shown in FIG. 6.

Referring to FIG. 6, the thyristor comprises a semiconductor substrate 21 of four-layer structure which is composed of a $p_E$ layer, an $n_B$ layer, a $p_B$ layer and an $N_E$ layer of alternately different conductivity types. The semiconductor substrate 21 is securely fixed to a supporting plate 22 by a soldering material 23. Gate electrode films 24 are provided on the $p_B$ layer, and emitter electrode films 25 are provided on the $n_E$ layer. A cathode electrode plate 26 is arranged to be slidable to engage with the emitter electrode films 25. A surface stabilizing film 27 of material such as SiO₂ covers the upper main surface of the semiconductor substrate 21 except the portions having the films 24 and 25 as shown.

In a condition in which a positive potential and a negative potential are applied to the supporting plate 22 and cathode electrode plate 26 respectively, both of the diode region composed of the $p_E$, $n_B$ and $n_E$ layers and the thyristor region composed of the $p_E$, $n_B$, $p_B$ and $n_E$ layers operate to maintain the conducting state.

On the other hand, when a positive potential and a negative potential are applied to the cathode electrode plate 26 and gate electrode films 24 respectively, the pn junction formed by the $p_B$ layer and $n_B$ layer is reverse-biased, with the result that a depletion layer as shown by the dotted lines is formed in the $n_B$ layer to inhibit the flow of current.

The $n_E$ layer is divided into a plurality of respectively independent regions so as to facilitate the formation of the depletion layer thereby facilitating the transition to the blocking state from the conducting state. However, during the formation of the $n_E$ layer by a technique such as an impurity diffusion technique, unusual diffusion of the impurity may occur resulting in formation of a spike portion C as shown in FIG. 6. The impurity concentration of the $n_E$ layer is selected to be higher than that of the $n_B$ layer. When the depletion layer is formed and reaches the spike portion C of the $n_E$ region, this spike portion C acts as a channel stopper, and the depletion layer is obstructed from extending beyond this portion. Consequently, the depletion layer cannot spread over the desired area, and a predetermined breakdown voltage level is not attained. Sometimes, the gate and the cathode may be short-circuited resulting in disappearance of the depletion layer, and the semiconductor substrate 21 will be restored to its conducting state from the blocking state. Such a spike portion C is a defective portion and provides a source of a malfunction of the semiconductor substrate 21. Such a malfunction does not occur unless a voltage is applied across the defective $n_E$ region having the spike portion C.

According to the present invention, a substantial portion of the cathode film 25 deposited on the defective $n_E$ region having the spike portion C is removed by trimming with a cutting tool. The numeral 25a designates the portion of the cathode film 25 left after the trimming process. An electrical insulating film 29 is then deposited on the remaining cathode film 25a to improve the electrical insulation. Since no voltage is now applied across the defective $n_E$ region having the substantial portion of the cathode film 25 trimmed according to the present invention, the semiconductor substrate 21 is freed from the problem of breakdown voltage reduction due to the disappearance of the depletion layer and can normally perform the function of the static induction thyristor.

We claim:

1. A method of manufacturing a semiconductor device comprising the steps of:
   (a) preparing a semiconductor substrate which includes at least three semiconductor layers of alternately different conductivity types and in which one of said semiconductor layers is exposed in a main surface of the substrate and is divided into a plurality of respectively independent regions, at least one of said plural regions having a defect therein;
   (b) depositing electrode films on exposed surfaces of said plural regions respectively; and
   (c) removing a substantial partial portion of said electrode film, including the whole of a top surface layer thereof, deposited on a region having a defect, among said plural regions in said semiconductor substrate, so that said region having a defect is remained covered with an unremoved layer of said electrode film, thereby lowering the surface level of said electrode film relative to that of the others.

2. A method of manufacturing a semiconductor device as claimed in claim 1, wherein said removing is effected by means of a cutting tool.

3. A method of manufacturing a semiconductor device as claimed in claim 1, wherein a surface stabilizing film is provided on exposed surfaces adjacent the surfaces having the electrode films thereon, and wherein said removing is effected by bringing a cutting tool into engagement with a top surface of the surface stabilizing film provided adjacent to said electrode film deposited on said region having a defect, said top surface of the surface stabilizing film being at a lower level than the top surface of said electrode film.

4. A method of manufacturing a semiconductor device as claimed in claim 3, wherein said surface stabilizing film is harder than said cutting tool, and said stabilizing film has a smooth surface.

5. A method of manufacturing a semiconductor device as claimed in claim 1, wherein said removing is effected by means of a cutting tool before said electrode film is alloyed with said semiconductor layer.

6. A method of manufacturing a semiconductor device as claimed in claim 1, further comprising the step of covering the unremoved layer of said partially removed electrode film with an electrical insulating film.

7. A method of manufacturing a semiconductor device as claimed in claim 6, wherein said electrical insulating film is a polyimide resin.

8. A method of manufacturing a semiconductor device as claimed in claim 2 or 3, wherein said removing is performed without said cutting tool making direct engagement with the semiconductor substrate.

9. A method of manufacturing a semiconductor device as claimed in claim 3, wherein the surface stabilizing film is made of a material selected from the group consisting of $SiO_2$, $Si_3N_4$, SiN, $P_2O_5$-$SiO_2$ glass and $B_2O_3$-$SiO_2$ glass.

10. A method of manufacturing a semiconductor device as claimed in claim 1, 2, or 3, wherein, after said removing step, an electrode plate is positioned against and pressed against said electrode films not having had their surface levels lowered, whereby said electrode plate provides electrical contact with said electrode films deposited on regions not containing a defect and does not provide electrical contact with the unremoved layer of said partially removed electrode films on regions containing a defect.

* * * * *